United States Patent [19]
McCullough et al.

[11] Patent Number: 5,908,510
[45] Date of Patent: *Jun. 1, 1999

[54] RESIDUE REMOVAL BY SUPERCRITICAL FLUIDS

[75] Inventors: Kenneth John McCullough, Fishkill; Robert Joseph Purtell, Mohegan Lake, both of N.Y.; Laura Beth Rothman, South Kent, Conn.; Jin-Jwang Wu, Fishkill, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/731,538

[22] Filed: Oct. 16, 1996

[51] Int. Cl.[6] ................................................ C03C 23/00
[52] U.S. Cl. ............................................................. 134/2
[58] Field of Search ........................ 134/2, 1, 1.1, 1.2, 134/1.3, 4

[56] References Cited

U.S. PATENT DOCUMENTS

| | | | |
|---|---|---|---|
| 3,890,176 | 6/1975 | Bolon | 156/2 |
| 4,944,837 | 7/1990 | Nishikawa et al. | 156/646 |
| 5,013,366 | 5/1991 | Jackson et al. | 134/1 |
| 5,068,040 | 11/1991 | Jackson | 210/748 |
| 5,105,556 | 4/1992 | Kurokawa et al. | 34/12 |
| 5,185,058 | 2/1993 | Cathey, Jr. | 156/656 |
| 5,185,296 | 2/1993 | Morita et al. | 437/229 |
| 5,213,619 | 5/1993 | Jackson et al. | 134/1 |
| 5,215,592 | 6/1993 | Jackson | 134/1 |
| 5,236,602 | 8/1993 | Jackson | 210/748 |
| 5,267,455 | 12/1993 | Dewees et al. | |
| 5,294,261 | 3/1994 | McDermott et al. | 134/7 |
| 5,304,515 | 4/1994 | Morita et al. | 437/231 |
| 5,306,350 | 4/1994 | Hoy et al. | 134/22.19 |
| 5,334,332 | 8/1994 | Lee | 252/548 |
| 5,344,493 | 9/1994 | Jackson | 134/1 |
| 5,368,171 | 11/1994 | Jackson | 134/147 |
| 5,377,705 | 1/1995 | Smith, Jr. et al. | |
| 5,403,621 | 4/1995 | Jackson et al. | 427/255.1 |
| 5,417,768 | 5/1995 | Smith, Jr. et al. | 134/10 |
| 5,522,938 | 6/1996 | O'Brien | |

FOREIGN PATENT DOCUMENTS

| | | |
|---|---|---|
| 0 391 035 | 10/1990 | European Pat. Off. . |
| 0 572 913 | 12/1993 | European Pat. Off. ........ B01D 11/02 |
| 0 587 168 | 3/1994 | European Pat. Off. . |
| 0 726 099 | 8/1996 | European Pat. Off. .......... B08B 5/00 |

OTHER PUBLICATIONS

Guan, Zhibin et al., "Fluorocarbon–Based Heterophase Polymeric Materials." *Macromolecules*, 1994, 27, pp. 5527–5532.

D.H. Ziger, et al., "Compressed Fluid Technology: Application to RIE–Developed Resists", *AICaE Journal*, 1987, 33, pp. 1585–1591.

*Encylopedia of Chemical Technology*, Third Edition, "Supercritical Fluids", John Wiley & Sons, 1984, pp. 872–891.

*Primary Examiner*—Marian C. Knode
*Assistant Examiner*—Brenda G. Brumback
*Attorney, Agent, or Firm*—Scully, Scott, Murphy & Presser; Robert M. Trepp

[57] ABSTRACT

A method for the removal of residue from an etched precision surface such as a semiconductor sample is provided which comprises exposing said precision surface to a supercritical fluid or liquid $CO_2$ under appropriate conditions that are sufficient to remove the residue from the precision surface. Cryogenic aerosol may be used in conjunction with either the supercritical fluid or liquid $CO_2$.

23 Claims, 9 Drawing Sheets

RESIDUE REMOVAL BY SUPERCRITICAL FLUIDS

TECHNICAL FIELD

The present invention relates to a method for removing residue material from a precision surface, e.g. a semiconductor sample, which has been first subjected to an etching process, such as reactive ion etching, (RIE). Specifically, the present invention provides a method for removing residue formed by an etching process on a precision surface such as a semiconductor sample which comprises exposing the precision surface to a supercritical fluid under conditions which are sufficient to remove the residue material therefrom. An optional step of using a cryogenic aerosol after exposing the precision surface to a supercritical fluid is also contemplated herein. The process of the present invention eliminates the use of prior art solvents and acids in selected aspects of advanced semiconductor manufacturing processes for removing residue from a precision surface, e.g. a semiconductor sample.

In another embodiment of the present invention, liquid $CO_2$ is used as the solvent for removing residue from a precision surface, e.g. a semiconductor sample, which has been first subjected to an etching process such as reactive ion etching (RIE). This embodiment comprises exposing the precision surface containing the etched residue to liquid $CO_2$ under conditions which are sufficient to remove the residue from the precision surface. An optional step of using cryogenic aerosol to remove residue remaining after liquid $CO_2$ treatment is also contemplated herein.

BACKGROUND OF THE INVENTION

In the field of advanced semiconductor manufacturing, it is well known to expose a semiconductor sample, such as a semiconductor wafer containing blanket metal or insulating films and a photoresist exposed with patterns to a reactive ion etching (RIE) process using a mixture of gases containing but not limited to chlorine and/or fluorine. The purpose of such an etching process is to define patterns in the films. The photoresist is then typically stripped in an oxygen plasma. The remaining residues often need to be removed by chemicals and/or solvents in order to achieve high yield.

For example, Al metal etching is the most commonly used to define wiring on the semiconductor wafers. Despite cleaning and rinsing the semiconductor wafer, unwanted residue still remains on the top and the sidewalls of the metal lines. This unwanted residue, which remains on the top and sidewalls of the metal lines, reportedly includes the elements carbon, hydrogen, silicon, aluminum, fluorine, chlorine and oxygen. Such residue, which is referred to herein as RIE residue, is known to be conductive enough to cause shorts between metal lines. Moreover, the RIE residue may also cause adhesion problems between the metal lines and the overlying insulator. The RIE residue on metal lines may cause corrosion of the semiconductor sample. The RIE residue on polysilicon lines or oxide vias also cause yield loss problems. Thus, there is considerable interest in the field of advanced semiconductor manufacturing for developing a chemically safe and easy method for removing the RIE residue from a semiconductor sample.

The current method which is typically being used for removal of this unwanted RIE residue in advanced semiconductor manufacturing processes involves soaking the etched semiconductor sample in an acid bath.

These and other objectives are met by the present method which uses a supercritical fluid or liquid $CO_2$ as solvents for removing the residue from a precision surface which has been first subjected to an etching process.

It is emphasized that supercritical fluids, such as supercritical fluid $CO_2$, are, however, currently being used in semiconductor processing for developing a resist pattern layer on a substrate. Such a process is disclosed, for example, in U.S. Pat. No. 4,944,837 to Nishikawa et al. Specifically, Nishikawa et al. provides a method of forming a patterned resist film having a predetermined pattern on a surface layer formed on a substrate comprising the steps of depositing a resist film on the surface layer, pre-processing the resist film into a pre-processed resist film which is attached to the surface layer and which has a latent image of the predetermined pattern, and processing the pre-processed resist film into the patterned resist film. In accordance with the disclosure of Nishikawa et al., the processing step comprises introducing the pre-processed resist film together with the substrate into a supercritical atmosphere and developing the pre-processed film in a supercritical atmosphere to selectively remove the pre-processed film.

Other examples of using supercritical fluids in semiconductor manufacturing are disclosed in U.S. Pat. Nos. 5,185,296 and 5,304,515, both to Morita et al. In both of these disclosures, supercritical fluids are used for forming a dielectric thin film or pattern thereof on the surface of a semiconductor substrate. As in the above reference to Nishikawa et al., the supercritical fluids are used in both of the Morita et al. references to develop the pattern resist film on the surface of the semiconductor substrate.

In an article by ziger et al. entitled "Compressed Fluid Technology: Application to RIE-Developed Resists", AICHE Journal, Vol. 33, No. 10, October 1978, compressed $CO_2$ i.e., supercritical fluid $CO_2$, is utilized in the area of microlithography to extract nonvolatile siloxane molecules from a host organic polymer.

Despite the use of supercritical fluids in the prior art there is no known disclosure of using a supercritical fluid to remove residue from a precision surface such as a semiconductor sample which contains such residue thereon.

SUMMARY OF THE INVENTION

The present invention provides an improved method for the removal of residue from a precision surface comprising exposing the precision surface containing the residue to a supercritical fluid under conditions which are sufficient for removing the residue from the precision surface. It is emphasized that the residue on the surface is formed by subjecting the surface to a material removal process such as chemical etching, ion etching, or laser ablation, in the process of creating or modifying a precision surface. The residue formed may be on etched surfaces or adjacent non-etched surfaces. The residue is then removed from the surface by exposure to a supercritical fluid.

The use of supercritical fluids for removing residue from precision surfaces such as semiconductor samples eliminates the prior art use of, but not limited to, a carcinogenic bath containing chromic phosphoric acid. Thus, the present invention provides an efficient and safe means for removing etchant residue from a precision surface containing such residue.

The term "precision surface" as used herein denotes a material which has controlled features below the plane of the surface such as cavities, trenches or channels incorporated into the material and or raised features such as mesas. Cleaning of this type of surface must be selective to the residue and not modify the surface geometry (dimensions).

Precision surfaces include, but are not limited to, semiconductors samples, metals, polymers and insulators.

The term "supercritical fluid" is used herein to denote a material which is under conditions of not lower than a critical temperature, $T_c$, and not less than a critical pressure, $P_c$, in a pressure-temperature diagram of an intended compound. For a complete description on the theory of supercritical fluids see Kirk-Othmer Encyclopedia of Chemical Technology, 3d, Supplement Volume, pp. 872–893. The preferred supercritical fluid employed in the present invention is $CO_2$ which may be used alone or in an admixture with another additive such as Ar, $NH_3$, $N_2$, $CH_4$, $C_2H_4$, $CHF_3$, $C_2H_6$, n-$C_3H_8$, $H_2O$, $N_2O$ and the like. Surfactants containing at least one $CF_x$ functional group may also be used in conjunction with a supercritical fluid.

In another embodiment of the present invention, a two step process for removing residue from an etched precision surface is provided. In accordance with this embodiment of the present invention, an etched precision surface containing residue is first exposed to a supercritical fluid under conditions sufficient to detach said residue from the precision surface and then the exposed precision surface is contacted with a cryogenic aerosol to remove the remaining residue not removed by supercritical fluid treatment from the precision surface.

In a third embodiment of the present invention, liquid $CO_2$ is used for removing residue from an etched precision surface containing the same. In accordance with this embodiment of the present invention, an etched precision surface containing residue is exposed to liquid $CO_2$ under conditions sufficient to remove said residue from the precision surface.

In a fourth embodiment of the present invention, liquid $CO_2$ is used in conjunction with a cryogenic aerosol, in a two step process, to remove residue from an etched precision surface. In this embodiment of the present invention, the etched precision surface containing the residue is exposed to liquid $CO_2$ under appropriate conditions and then the exposed precision surface is contacted with a cryogenic aerosol under conditions sufficient to remove the remaining residue not previously removed by the liquid $CO_2$ treatment step from the precision surface.

DESCRIPTION OF THE PREFERRED EMBODIMENT

In accordance with the first embodiment of the present invention, residue which is present on an etched precision surface is removed from the precision surface by using supercritical fluids. Specifically, the residue is removed from an etched precision surface by exposing the precision surface to a supercritical fluid under conditions which are sufficient to remove said residue.

It is emphasized that the precision surface is first etched prior to exposing it to a supercritical fluid. Etching of the precision surface may be conducted using techniques well known to those skilled in the art. Suitable techniques for etching the precision surface include, but are not limited to, reactive ion etching (RIE), ion beam etching (IBE), plasma etching, laser ablation and the like. Of these etching techniques, RIE is particularly preferred in the present invention. Typically, in the prior art, RIE is carried out using gases containing, but not limited to, Cl or F.

The residue left behind after etching a precision surface may contain one or more of the following elements: carbon, hydrogen, silicon, aluminum, Ti, Ta, W, Pt, Pd, Ir, Cr, fluorine, chlorine or oxygen.

As stated above, the term "precision surface" is used herein denote a material which contains a surface that has cavities, trenches and/or channels incorporated therein. Suitable precision surfaces that may be employed in the present invention include, but are not limited to, semiconductor samples, metals such as Al, Si, W, Ti, Ta, Pt, Pd, Ir, Cr, Cu, and Ag, polymers such as polyimides, polyamides and the like, and insulators. Of these precision surfaces, semiconductor samples are particularly preferred in the present invention.

It should be noted that the description provided hereinbelow while being specific to RIE semiconductor samples is also valid for other types of precision surfaces which may be etched by any of the aforementioned etching techniques. For example, the description provided hereinbelow also applies to an IBE insulator, a laser ablated polymer and the like.

Figure 1:
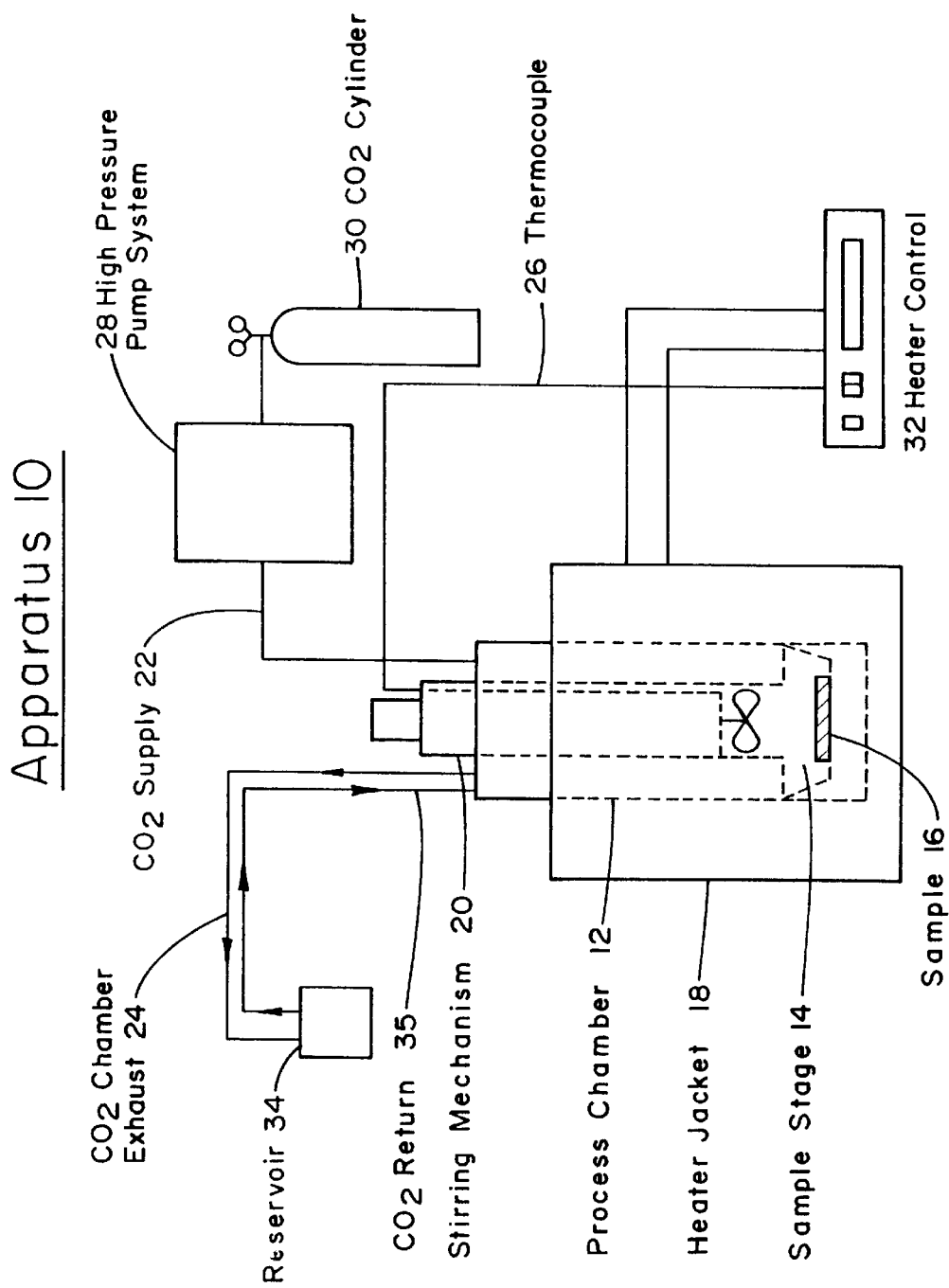
FIG. 1 is a schematic diagram of the apparatus which is employed in the instant invention for the removal of residue from a precision surface such as a semiconductor sample.

FIG. 1 is a schematic diagram of an apparatus 10 that can be used in the present invention for removing RIE residue from a semiconductor sample containing the same. Apparatus 10 includes process chamber 12 having a sample zone 14 wherein the semiconductor sample 16 is placed. The process chamber 12 is surrounded by heater jacket 18 and contains, optionally, a stirring mechanism 20. Additionally, the process chamber contains inlet line 22, outduct 24 and thermocouple 26. The inlet line 22 contains a high pressure pump system 28 which is connected to gas cylinder 30 for supplying a supercritical fluid or mixture thereof to process chamber 12. Thermocouple 26 is also connected to heater control 32 which is utilized for controlling and monitoring the temperature of the RIE residue removal process. Apparatus 10 may also include reservoir 34 for collecting and/or purifying supercritical fluids that exit process chamber 12 through outduct 24. This material may then be recycled into the process chamber via duct 35. Gas cylinder 30 contains a pressurized liquid. The term supercritical fluid refers to the state of matter of a material above its critical point, i.e., a critical temperature, $T_c$, and critical pressure, $P_c$, at which two phases of a substance, in equilibrium with each other, become identical, forming one phase. Any supercritical fluid known to those skilled in the art such as $CO_2$ and/or Ar may be used in the present invention provided that they are capable of removing the RIE residue from the semiconductor sample. The preferred supercritical fluid is $CO_2$ which may be used alone or in an admixture with one or more additives selective from the group consisting of Ar, $N_2O$, $NH_3$, $N_2$, $CH_4$, $C_2H_4$, $CHF_3$, $C_2H_6$, $H_2O$, n-$C_3H_8$, and the like.

Any grade of supercritical fluid can be employed in the present invention. If a low grade of supercritical fluid is employed which contains a lot of impurities therein, the supercritical fluid can be first purified to remove the impurities using techniques well known to those skilled in the art. For instance, the low grade supercritical fluid could be purified by passing it through a column prior to entering the processing chamber.

It is also emphasized that the supercritical fluid could be combined with additives or surfactants which would aid in removing the RIE residue from the semiconductor sample. Suitable additives include, but are not limited to, those mentioned hereinabove. Of these additives, $H_2O$ is most particularly preferred.

The types of surfactants that may be used in the present invention include any surfactant which contains at least one $CF_x$ functional group in its structure.

As shown in FIG. 1, the supercritical fluid is pre-pressurized with a high pressure pump. Typically, in the present invention, the supercritical fluid is pre-pressurized to a pressure of about 1000 psi to 6000 psi. More preferably, the supercritical fluid is pre-pressurized to a pressure of about 3000 psi before entering the processing chamber. The pre-pressurized supercritical fluid is then transferred to the processing chamber which contains a semiconductor sample through inlet line 22.

The semiconductor samples that can be employed in the present invention are any semiconductor samples that are processed by RIE or any of the other etching techniques mentioned hereinabove. Illustrated examples of suitable semiconductor samples that may be used in the present invention include, but are not limited to, semiconductor wafers, semiconductor chips, ceramic substrates, patterned film structures and the like.

Besides what is used in illustrating the invention, the semiconductor sample, which may be subjected to the method of the present invention, may include one or more of the following materials: titanium silicides, tantalum nitride, tantalum silicide, silicon, polysilicon, silicon nitride, $SiO_2$, diamond-like carbon, polyimides, polyamides, aluminum, aluminum with copper, copper, tungsten, titanium, palladium, platinum, iridium, chromium, ferroelectric materials and high dielectric materials such as BaSrTi or PbLaTi oxides.

The semiconductor sample containing the RIE residue is placed in sample zone 16 of process chamber 12 wherein the sample is exposed to the supercritical fluid under conditions which are sufficient to remove the RIE residue from the sample while maintaining the supercritical fluid above its critical temperature and pressure.

Typically, in the present invention the pressure within the process chamber during RIE residue removal is from about 1000 psi to about 6000 psi. More preferably, the pressure within the process chamber during RIE residue removal is about 3000 psi.

The temperature within the processing chamber during the RIE residue removal which is monitored by thermocouple 26 and controlled by controller 32 is generally from about 40° C. to about 80° C. More preferably, the temperature within the process chamber during RIE residue removal is about 40° C.

To ensure effective removal of the RIE residue from the semiconductor sample, the semiconductor sample should be exposed to the supercritical fluid under the above conditions for about 30 minutes to about 2 hrs. More preferably, the time period for exposure of the semiconductor sample to the supercritical fluid under the above-identified conditions is about 1 hr.

The supercritical fluid exiting the process chamber through outduct 24 may be cleaned, as described above, and recycled back into the apparatus so as to form a closed reactor system. Such a closed reactor system, which is not shown in FIG. 1, would greatly reduce the processing cost in producing clean semiconductor samples.

When stirring is employed within the processing chamber, the speed of the stirring unit may vary from about 500 rpm. to about 2500 rpm., preferably about 1000 rpm.

In accordance with the second embodiment of the present invention, a method for removing residue from an etched precision surface such as a RIE semiconductor sample is provided which comprises the steps of exposing the precision surface to a supercritical fluid and then contacting the exposed precision surface to a cryogenic aerosol. A highly preferred precision surface used in this embodiment of the present invention is a RIE semiconductor sample.

The term "cryogenic aerosol" as used herein denotes a solid jet spray which is formed when a relatively high pressure gas liquid mixture is allowed to rapidly expand into a region of lower pressure at cryogenic temperatures, cooling the jet and causing the mixture to solidify. Cryogenic aerosols comprising argon, nitrogen and/or $CO_2$ may be employed in the present invention in removing residue from a precision surface.

When cryogenic aerosol is used, the cryogenic aerosol contacts the exposed semiconductor sample under conditions which are sufficient to remove the remaining residue detached during the supercritical fluid treatment process. Such conditions are well known to those skilled in the art.

In the third embodiment of the present invention, liquid $CO_2$ is used as the solvent instead of a supercritical fluid for removing residue from a precision surface that has been previously etched by one of the aforementioned etching processes. The preferred precision surface employed in this third embodiment of the instant invention is a semiconductor sample which was been etched by RIE.

The apparatus used in this third embodiment of the present invention is similar to the one shown in FIG. 1 except that the gas cylinder contains gaseous $CO_2$ which is made into a liquid by pre-pressurizing the gas to a total pressure of about 880 psi to about 1000 psi. More preferably, the gaseous $CO_2$ is pressurized to about 880 psi.

Any grade of gaseous $CO_2$ made be used, however, if the impurity level within the gas is too high the gas should be purified by the above identified techniques prior to be converted into the liquid state.

The conditions used in this third embodiment are not as severe as that described above since no supercritical fluid is employed. Typically, in this third embodiment, the pressure within the processing chamber during residue removal is from about 880 psi to about 1000 psi. More preferably, when liquid $CO_2$ is employed the pressure within the processing chamber is about 880 psi.

The temperature which is used in this third embodiment of the present invention is generally from about 25° C. to about 40° C. More preferably, when liquid $CO_2$ is employed, the temperature within the processing chamber during residue removal is about 40° C.

Sufficient residue removal using liquid $CO_2$ is obtained generally within a period of time of from about 30 minutes to about 2 hrs. More preferably, sufficient residue removal using liquid $CO_2$ is generally obtained within a time period of about 1 hr.

The liquid $CO_2$ may be used alone or it may be used with one of the surfactants or additives described hereinabove. The preferred additive used with liquid $CO_2$ is $H_2O$.

When stirring is employed in this third embodiment, the stirring speed is from about 500 rpm to about 2500 rpm. More preferably, the stirring speed in the third embodiment is about 1000 rpm.

In the fourth embodiment of the present invention, the residue is removed from an etched precision surface using a two step process which comprises first exposing a precision surface containing etchant residue to liquid $CO_2$ under conditions defined above and then contacting the exposed semiconductor sample with a cryogenic aerosol under conditions to remove the remaining residue detached during the liquid $CO_2$ treatment.

The cryogenic aerosol used in this embodiment of the present invention is the same as that described hereinabove in the second embodiment. Moreover, the conditions are also the same as that reported hereinabove.

The following examples are given to illustrate the scope of the present invention. Because these examples are given for illustrative purposes only, the invention embodied therein should not be limited thereto.

EXAMPLE 1

In this example, RIE residue is removed from semiconductor wafers using supercritical fluid $CO_2$ as the solvent. Specifically, the semiconductor wafers containing a blanket metallization and a patterned photoresist were first exposed to a typical reactive ion etch process.

After etching of aluminum lines, the photoresist was stripped in an $O_2$-containing plasma using techniques well known to those skilled in the art.

Figure 2:
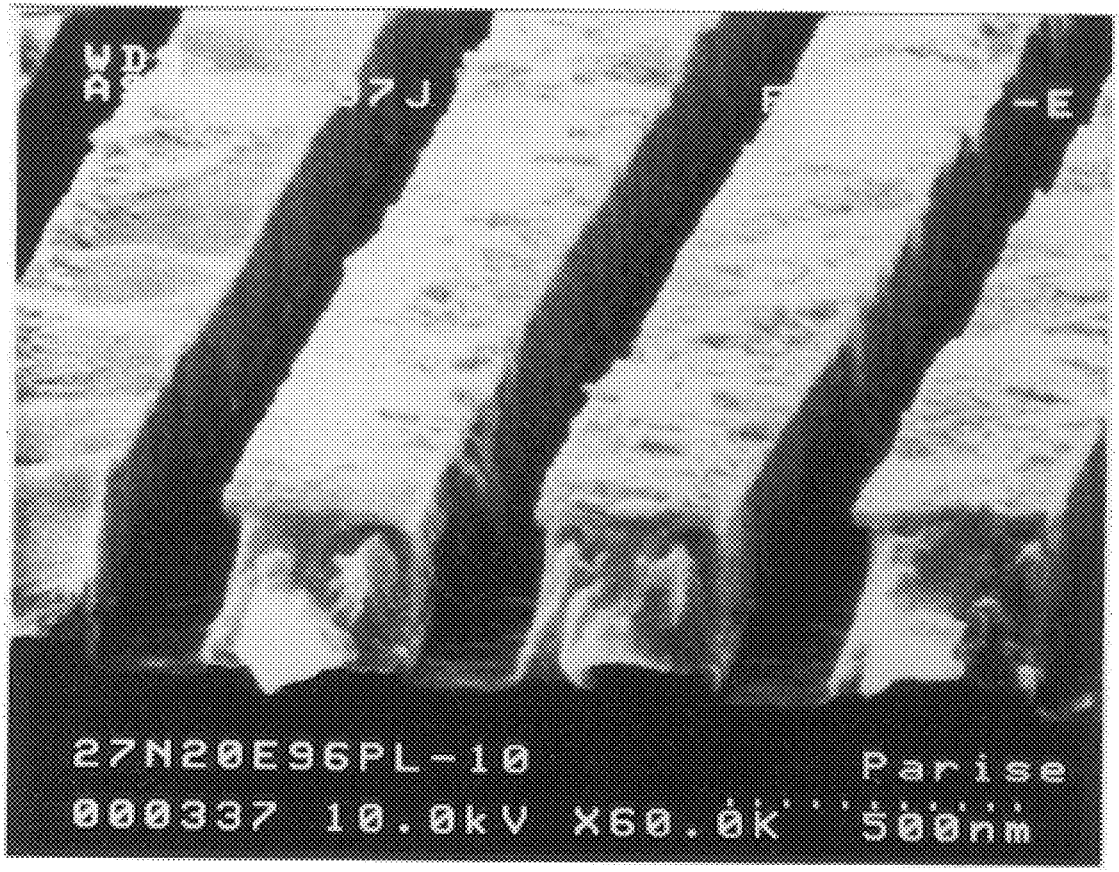
FIG. 2 is an SEM illustrating the metal line structures of a 200 mm semiconductor wafer which contains RIE reside, which was broken into several samples for testing.

A Scanning Electron Micrograph (SEM), of one of the wafers after processing is shown in FIG. 2. All the SEM's shown in FIGS. 2–7 of this example were done at 10 KEV using various magnifications and resolutions. Views from the top as well as the sides are also shown. Specifically, FIG. 2 shows the metal line structure of the RIE wafer which contains RIE residue deposit thereon.

Next, pieces of wafers, as shown in FIG. 2, containing RIE residue were loaded into a high pressure chamber as shown in FIG. 1. Supercritical extraction grade $CO_2$ was pre-pressurized to about 5840 psi using a mechanical pump and was introduced into the pressure chamber by using static pressure and flow mode. No stirring was utilized in this example.

Figure 3:
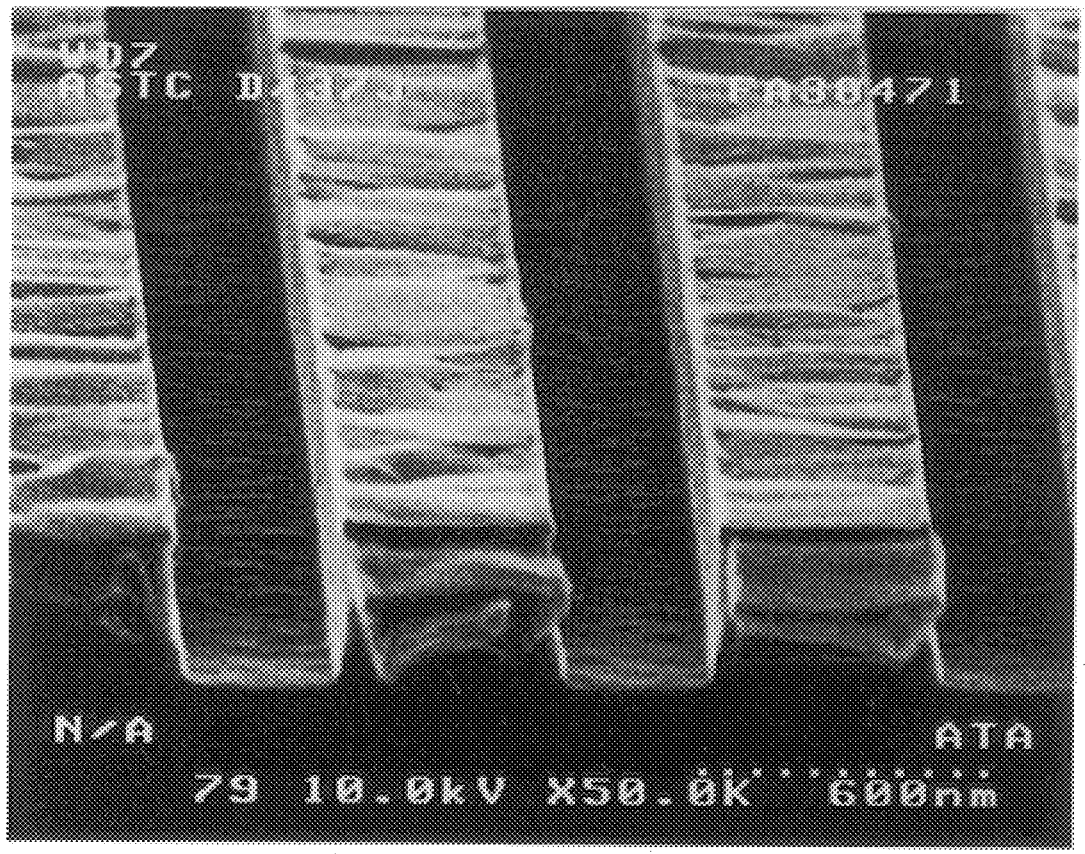
FIG. 3 is an SEM of a first piece of the wafer of FIG. 2 after exposure to supercritical fluid $CO_2$ for 2 hrs. at 40° C. and 5840 psi, 50K magnification, resolution 600 nm.

In a first experiment, one of the wafer pieces was exposed to supercritical fluid $CO_2$ for 2 hrs at a temperature of 40° C. and a pressure of 5840 psi. An SEM for this experiment is shown in FIG. 3. Specifically, this SEM shows a cleaned semiconductor sample. The sample initially contained RIE residue prior to exposure to a supercritical fluid under the above conditions.

Figure 4:
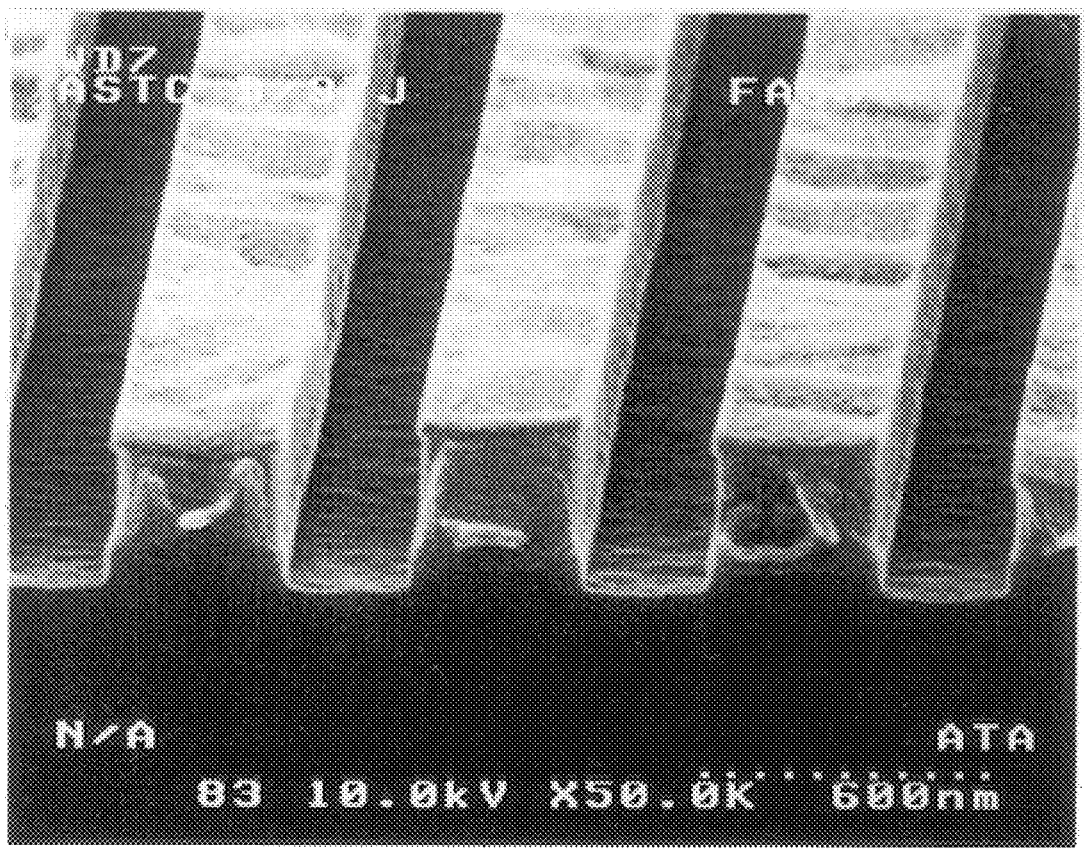
FIG. 4 is an SEM of a second piece of the wafer of FIG. 2 after exposure to supercritical $CO_2$ for 2 hrs. at 80° C. and 5840 psi, 50K magnification, resolution 600 nm.

In another experiment, a wafer was exposed to supercritical fluid $CO_2$ for 2 hrs. at a temperature of 80° C. and a pressure of 5840 psi. An SEM for this experiment is shown in FIG. 4. Again, this SEM illustrates that effective RIE residue removal is obtained by using the method of the present invention.

Figure 5:
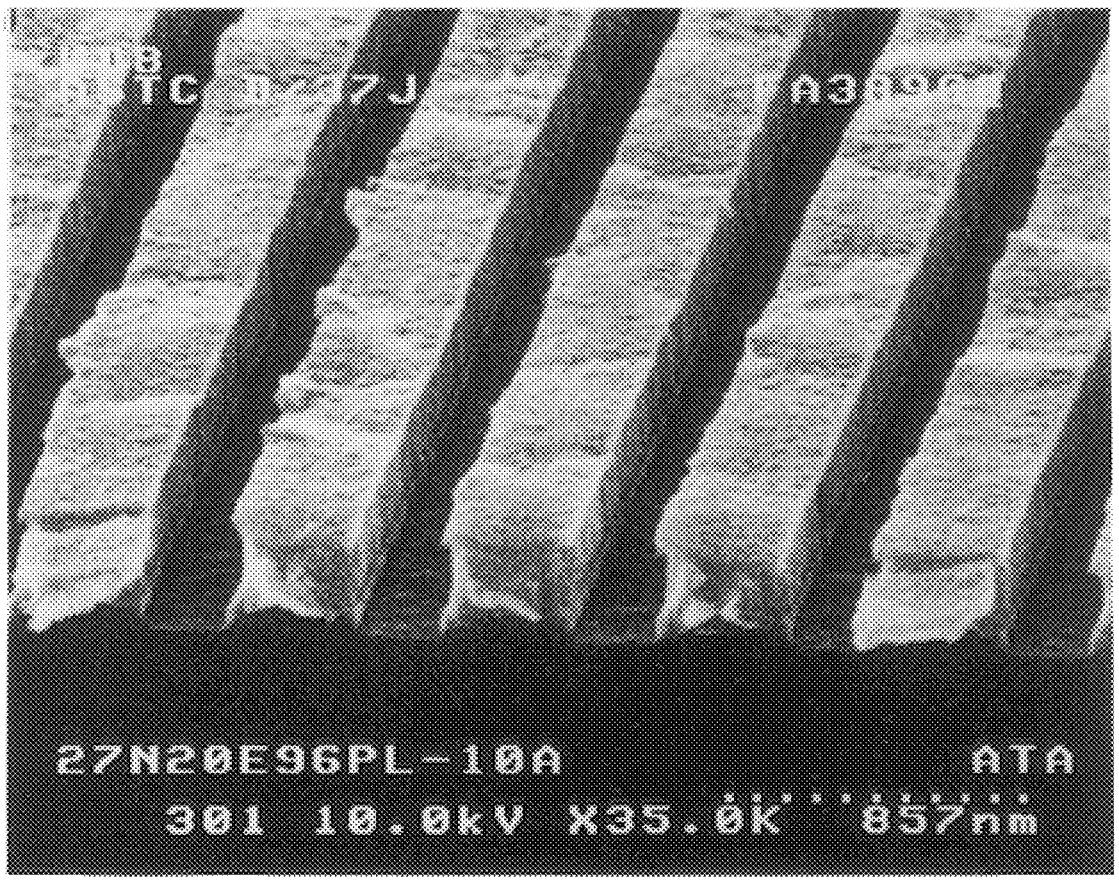
FIG. 5 is an SEM of a third piece of the wafer of FIG. 2 after exposure to supercritical fluid $CO_2$ for 30 minutes at 40° C. and 5840 psi, 35K magnification, resolution 857 nm.
Figure 6:
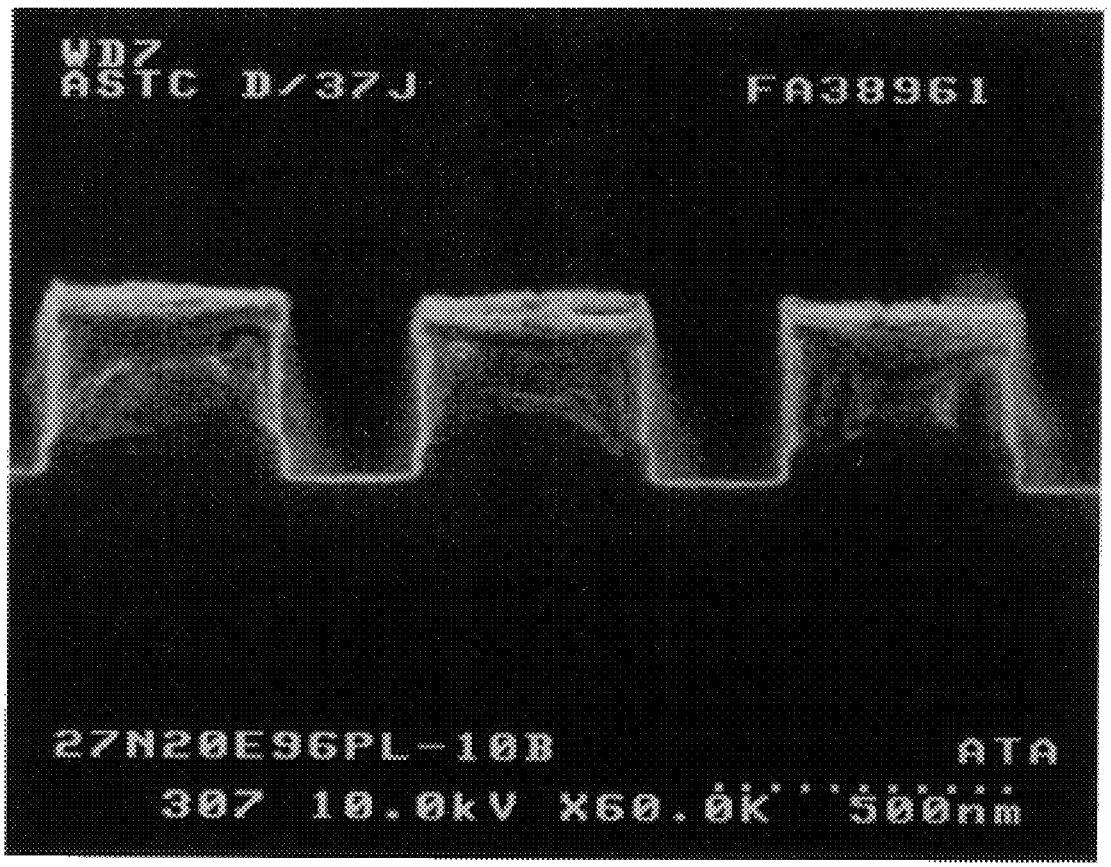
FIG. 6 is an SEM of a fourth piece of the wafer of FIG. 2 after exposure to supercritical fluid $CO_2$ for 1 hr. at 40° C. and 5840 psi, 60K magnification, resolution 500 nm.
Figure 7:
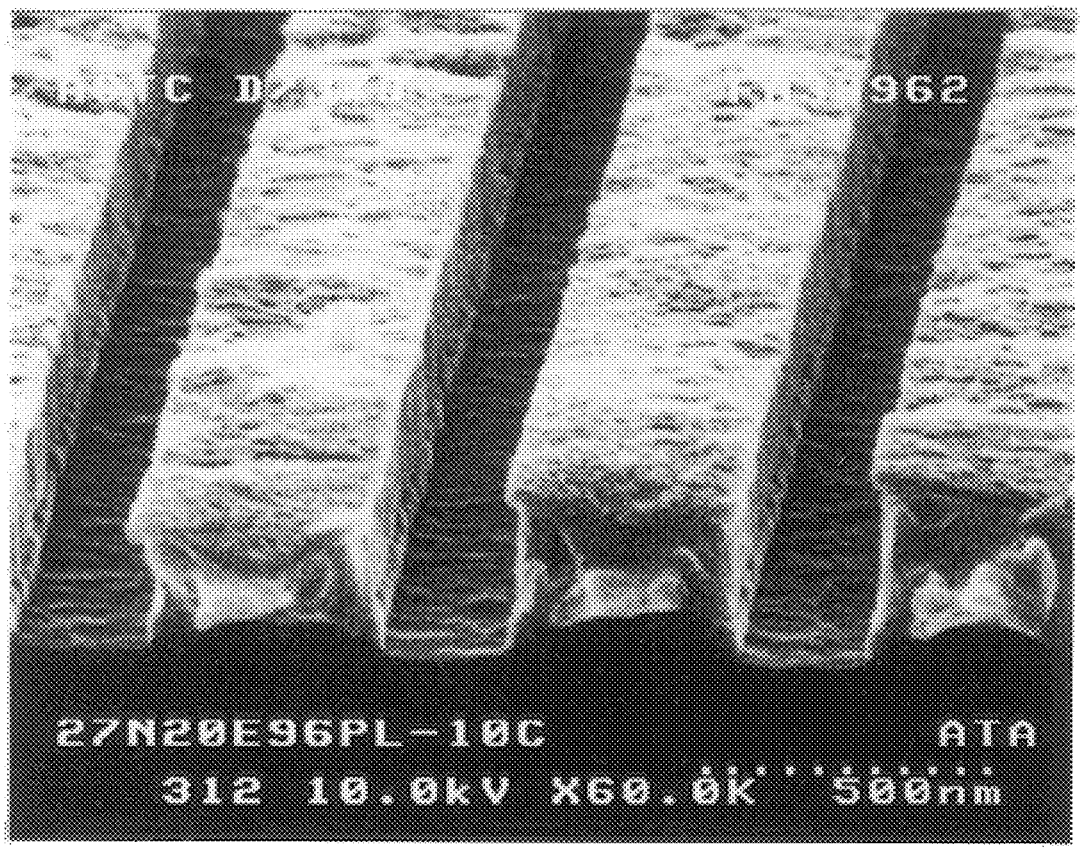
FIG. 7 is an SEM of a fifth piece of the wafer of FIG. 2 after exposure to supercritical $CO_2$ for 2 hr. at 40° C. and 5840 psi, 60K magnification, resolution 500 nm.

Further experiments were made at 40° C. and 5840 psi using processing times of 30 minutes, 1 hour and 2 hours. Those results are shown in FIGS. 5, 6 and 7, respectively. The RIE residue removal from the semiconductor wafers was shown to be more effective at 1 or 2 hours than at 30 minutes.

EXAMPLE 2

In this example, a section of a 200 mm wafer with vias etched in the oxide was subjected to supercritical $CO_2$.

Figure 8:
FIG. 8 is an SEM of a first piece of a 200 mm semiconductor wafer with vias etched in the oxide film shown from the side, 5 KV, 60K magnification, resolution 600 nm.
Figure 9:
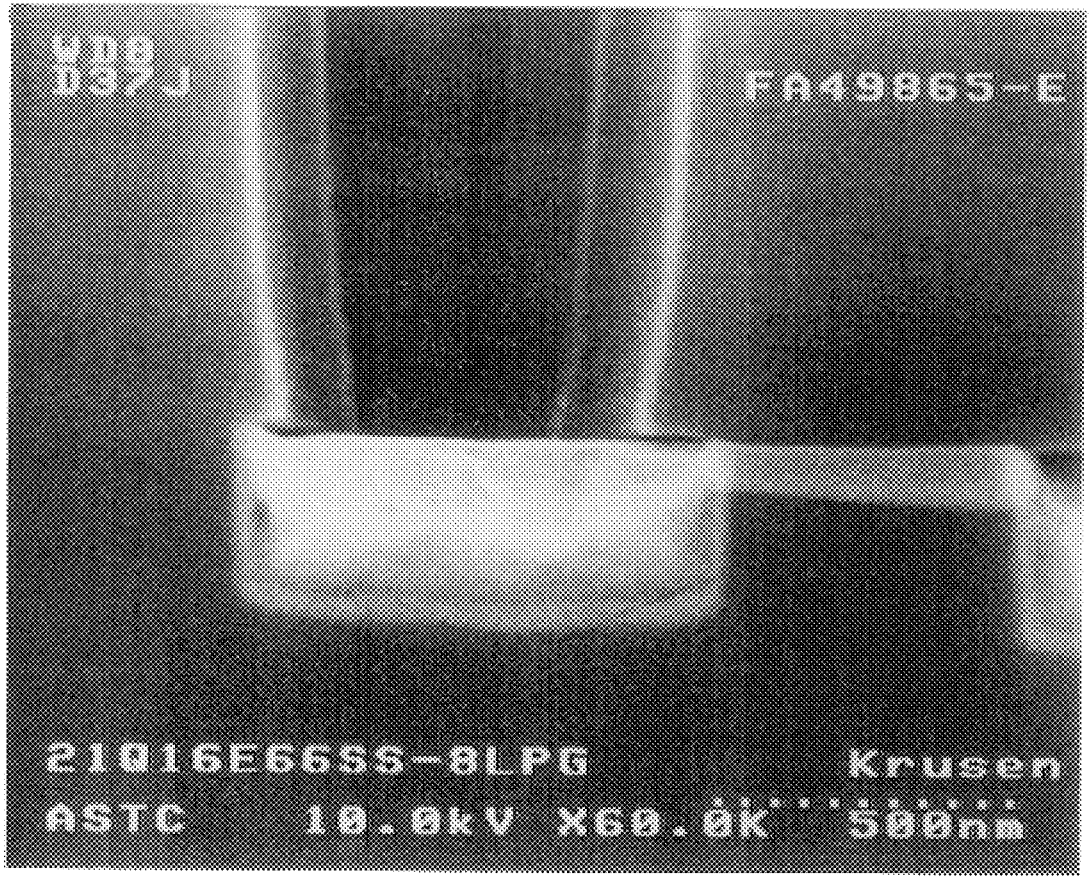
FIG. 9 is an SEM of a second piece of the 200 mm semiconductor wafer of FIG. 8 with vias etched in the oxide film, shown from the side, after processing in supercritical fluids, 10 KV, 60K magnification, resolution 500 nm.

Residue that was formed in the vias can be seen in FIG. 8 (side view). The wafer was exposed to supercritical fluid $CO_2$ for 1 hour at 3000 psi and 40° C. with stirring at 500 rpm. As shown in Figure FIG. 9 (side view), all RIE residue has been removed from the sample under these conditions.

While this invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letter Patent is:

1. A method for forming a clean precision surface comprising providing a reactive ion etched (RIE) precision surface having cavities, trenches or channels incorporated therein, wherein said RIE precision surface contains halogenated etched residue thereon; and continuously exposing said RIE precision surface containing said halogenated etched residue to a supercritical fluid under conditions sufficient to remove said halogenated etched residue from said RIE precision surface while maintaining the supercritical fluid above a single critical temperature and pressure.

2. The method of claim 1 wherein the precision surface is a semiconductor sample, a metal, a polymer or an insulator.

3. The method of claim 2 wherein the precision surface is a semiconductor sample.

4. The method of claim 3 wherein said semiconductor sample is a semiconductor wafer, semiconductor chip, ceramic substrate, or other patterned film structure.

5. The method of claim 4 wherein said semiconductor sample is a semiconductor wafer.

6. The method of claim 5 wherein said precision surface contains a material selected from the group consisting of titanium silicide, tantalum nitride, silicon, polysilicon, silicon nitride, $SiO_2$, diamond-like carbon, polyimides, polyamides, aluminum, aluminum with copper, copper, W, Ti, Ta, Pt, Pd, Ir, Cr, ferroelectric materials and high dielectric materials.

7. The method of claim 1 wherein said supercritical fluid comprises Ar, $CO_2$ or mixtures thereof.

8. The method of claim 7 wherein said supercritical fluid is $CO_2$.

9. The method of claim 1 wherein said surface is exposed to said supercritical fluid at a pressure of from about 1000 psi to about 6000 psi.

10. The method of claim 9 wherein said pressure is about 3000 psi.

11. The method of claim 1 wherein said surface is exposed to said supercritical fluid at a temperature of about 40° C. to about 80° C.

12. The method of claim 1 wherein said surface is exposed to said supercritical fluid for a time period of about 30 minutes to about 2 hrs.

13. The method of claim 12 wherein said time for said exposure is about 1 hr.

14. The method of claim 1 wherein said supercritical fluid is purified prior to use thereof.

15. The method of claim 1 wherein said supercritical fluid is stirred at about 500 rpm to about 2500 rpm.

16. The method of claim 15 wherein said supercritical fluid is stirred at about 1000 rpm.

17. The method of claim 1 wherein an additive or a surfactant is used with said supercritical fluid.

18. The method of claim 17 wherein said additive is selected from the group consisting of Ar, $N_2O$, $NH_3$, $N_2$, $CH_4$, $C_2H_4$, $CHF_3$, $C_2H_6$, n-$C_3H_8$ and $H_2O$.

19. The method of claim 18 wherein said additive is $H_2O$.

20. The method of claim 17 wherein said surfactant is a surfactant which contains at least one $CF_x$ functional group.

21. The method of claim 1 wherein said residue contains at least one element selected from the group consisting of carbon, hydrogen, silicon, aluminum, Ti, Ta, W, Pt, Pd, Ir, Cr, fluorine, chlorine and oxygen.

22. The method of claim 1 further comprising contacting said supercritical fluid exposed precision surface with a cryogenic aerosol under conditions sufficient to remove any remaining residue from said exposed precision surface.

23. The method of claim 22 wherein said cryogenic aerosol is comprised of Ar, $N_2$, $CO_2$ or a mixture thereof.

* * * * *